United States Patent [19]

Outram et al.

[11] 4,271,392
[45] Jun. 2, 1981

[54] LATCHING RELAY CIRCUITS AND ANALOG TO DIGITAL CONVERTERS

[75] Inventors: Stephen H. Outram, Frimley; Geoffrey A. Luckhurst, Yateley, both of England

[73] Assignee: The Solartron Electronic Group Limited, Farnborough-Hampshire, England

[21] Appl. No.: 943,028

[22] Filed: Sep. 18, 1978

[30] Foreign Application Priority Data

Sep. 29, 1977 [GB] United Kingdom ............... 40573/77

[51] Int. Cl.³ ..................... G01R 15/08; H01H 51/22; H03K 13/02
[52] U.S. Cl. ................................ 324/115; 324/99 D; 340/347 AD; 361/208
[58] Field of Search ............. 324/115, 99 D; 361/208, 361/186, 152, 194; 340/347 AD

[56] References Cited

U.S. PATENT DOCUMENTS

| | | | |
|---|---|---|---|
| 2,661,260 | 12/1953 | Salzman, Jr. ......................... | 324/115 |
| 2,859,402 | 11/1958 | Schaeve ............................... | 361/208 |
| 2,973,238 | 2/1961 | Herzog ................................. | 324/115 |
| 2,993,157 | 7/1961 | Bradley, Jr. ......................... | 324/115 |
| 3,237,102 | 2/1966 | Newell ................................. | 324/115 |
| 3,544,850 | 12/1970 | Casson ................................. | 361/194 |

FOREIGN PATENT DOCUMENTS 1375336 11/1974 United Kingdom .

Primary Examiner—Ernest F. Karlsen
Attorney, Agent, or Firm—Joseph J. Kaliko; Mikio Ishimaru; Dale V. Gaudier

[57] ABSTRACT

The variable attenuator and variable current shunt of a battery-powered auto-ranging digital multimeter uses latching relays, each of which, since it is stable in each of its two switching states, requires only a current pulse to change its state. The circuit which operates the relays provides a drive pulse only when the desired relay state differs from the actual state, thus minimizing the power required, and includes a tank circuit for minimizing disturbance to the multimeter power supply. To ensure that the tank circuit can recharge, each relay is driven by a tri-state output.

6 Claims, 5 Drawing Figures

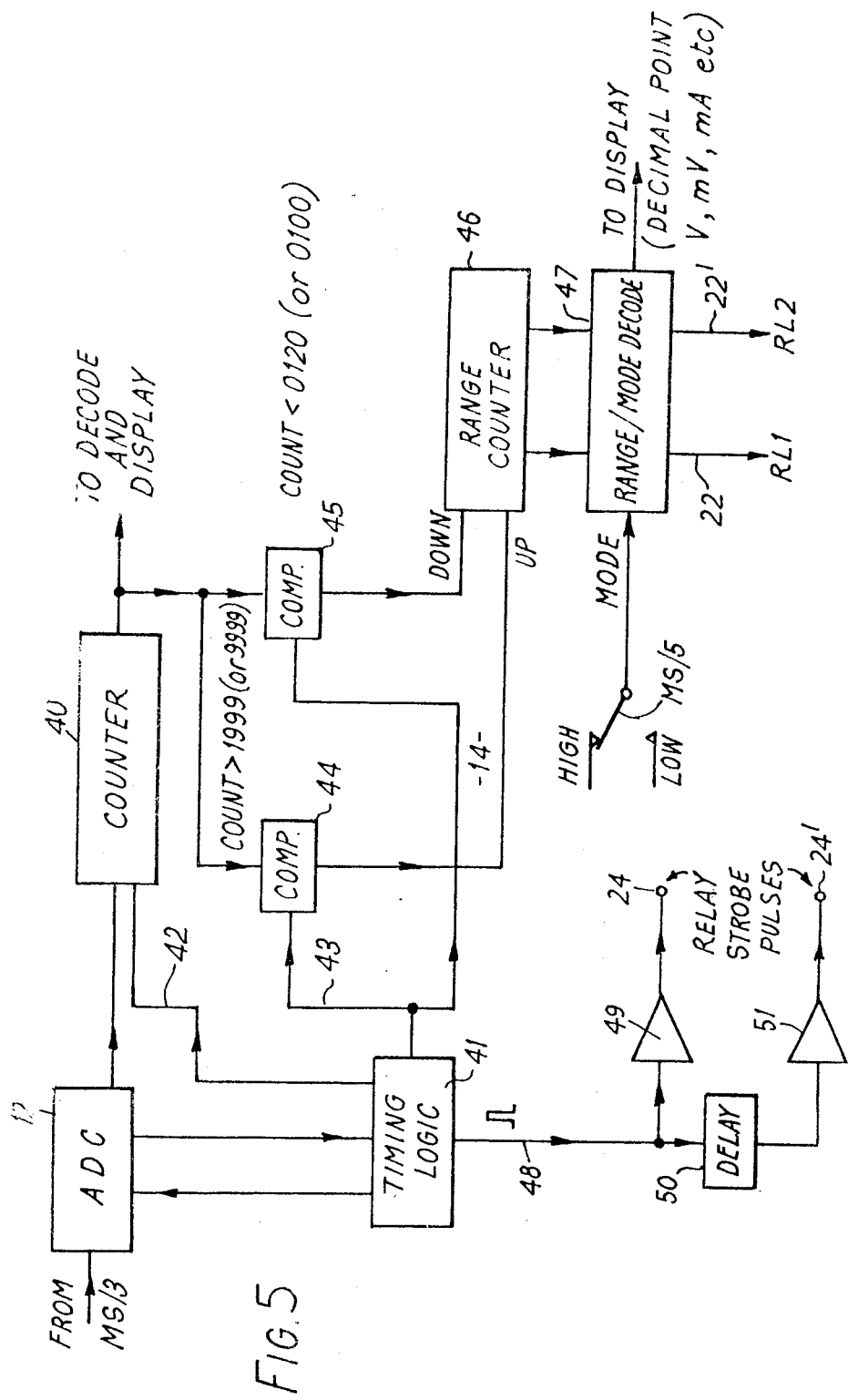

LATCHING RELAY CIRCUITS AND ANALOG TO DIGITAL CONVERTERS

BACKGROUND OF THE INVENTION

The present invention relates to latching relay circuits and to analog to digital converters (A D C's) with range switching facilities. The invention is particularly, but not exclusively concerned with such converters employed as multimeters, that is to say meters capable of selectively measuring at least current and voltage.

It is known to provide a manual switch to effect range switching of an A D C; the switch controls a switched attenuator in the case of an A D C employed as a voltmeter and controls a switched shunt in the case of an A D C employed as an ammeter. It is also known to employ relays instead of manual switches and to control the relays automatically in response to the digital output in such a way as to cause the digital output always to lie within a predetermined range, e.g. within the range N/10 to N where N is the maximum digital output. This is known as autoranging, i.e. automatic range selection.

The relays consume a significant amount of power and this creates a problem in the case of a battery-operated A D C. One object of this invention is to provide a latching relay circuit which can be set to either state by an operating pulse and which latches in either state. The invention is also concerned with an improved autoranging A D C in which latching relays are employed.

SUMMARY OF THE INVENTION

According to the invention in one aspect, there is provided a latching relay comprising an armature which is stable in either of first and second positions, an operating coil which, when energised by current of one sense, moves the armature to the first position and, when energised by current of the other sense, moves the armature to the second position, first and second terminals for energising the coil, a changeover contact which connects one end of the coil to the first and second terminals in the first and second positions respectively of the armature, and two switching devices connected between the other end of the coil and the first and second terminals respectively and operable by a control signal to complete a current path for current through the coil, of a sense determined by the position of the changeover contact.

It will be appreciated that the polarity of the first terminal is made such that the current which flows when the relay is in the first position changes the relay over to the second position, and vice versa. As will be explained below, a capacitor between the first and second terminals can be employed to store charge which enables a sufficiently high current to flow when the switching devices are operated.

According to the invention in another aspect there is provided an autoranging analog to digital converter having a range-switching input circuit including one or more latching relays for selecting the input range, the or each relay being stable in either of two positions, and a control circuit responsive to the digital output of the converter to apply control signal(s) to the relay(s) so to select the states thereof that the digital output is brought within a predetermined range.

A further advantage of this aspect of the invention is a significantly improved performance when measuring low input voltages of the order of microvolts. Conventional relays generate significant amounts of heat when energised. The relay contacts are heated and thermal EMF's are generated in series with the low input voltage to be measured. The use of latching relays overcomes this problem and we have found it possible to measure low input voltages accurately without significant introduction of error from thermal EMF's.

A digital multimeter may comprise voltage input terminals connected to a range-switching attenuator, separate current input terminals connected to a range-switching shunt and a mode switch which selectively connects the output of the attenuator or the current input terminals to an A D C. It may be convenient, in operation, to leave the current input terminals connected to a circuit under test while a voltage measurement is being made. if, however, the range-switching shunt is allowed to switch under these conditions, the varying impedance at the current input terminals can disturb the circuit under test.

According to the invention in another aspect, there is provided an autoranging digital multimeter comprising an analog to digital converter, voltage input terminals connected to a range-switching attenuator, current input terminals connected to a range-switching shunt, a mode switch operable selectively to connect the output of the attenuator, in a voltage mode, or the current input terminals, in a current mode, to the converter, one or more relays having contacts in both the range-switching attenuator and in the range-switching shunt, and a control circuit responsive to the digital output of the converter so to control the states of the relay(s) that the digital output is brought into a predetermined range regardless of the setting of the mode switch, and wherein the mode switch includes contacts which, in the voltage mode, by-pass the relay contacts in the relay-switching shunt and connect a fixed impedance across the current input terminals.

The fixed impedance is preferably part of the range-switching shunt, e.g. the lowest value resistor of a chain of resistors forming the shunt. The changes of relay states which occur in the voltage mode, as autoranging takes place, do not therefore influence the impedance at the current input terminals.

BRIEF DESCRIPTION OF THE DRAWINGS

The invention will be described in more detail, by way of example, with reference to the accompanying drawings, in which:

FIG. 5 shows the autoranging circuit of the multimeter.

DETAILED DESCRIPTION OF PREFERRED EMBODIMENTS

The multimeter is described only in relation to current and voltage measurements. A conventional current source circuit can be included for measuring resistance, by measuring the voltage across a resistor through which passes a reference current from the source.

Figure 1:
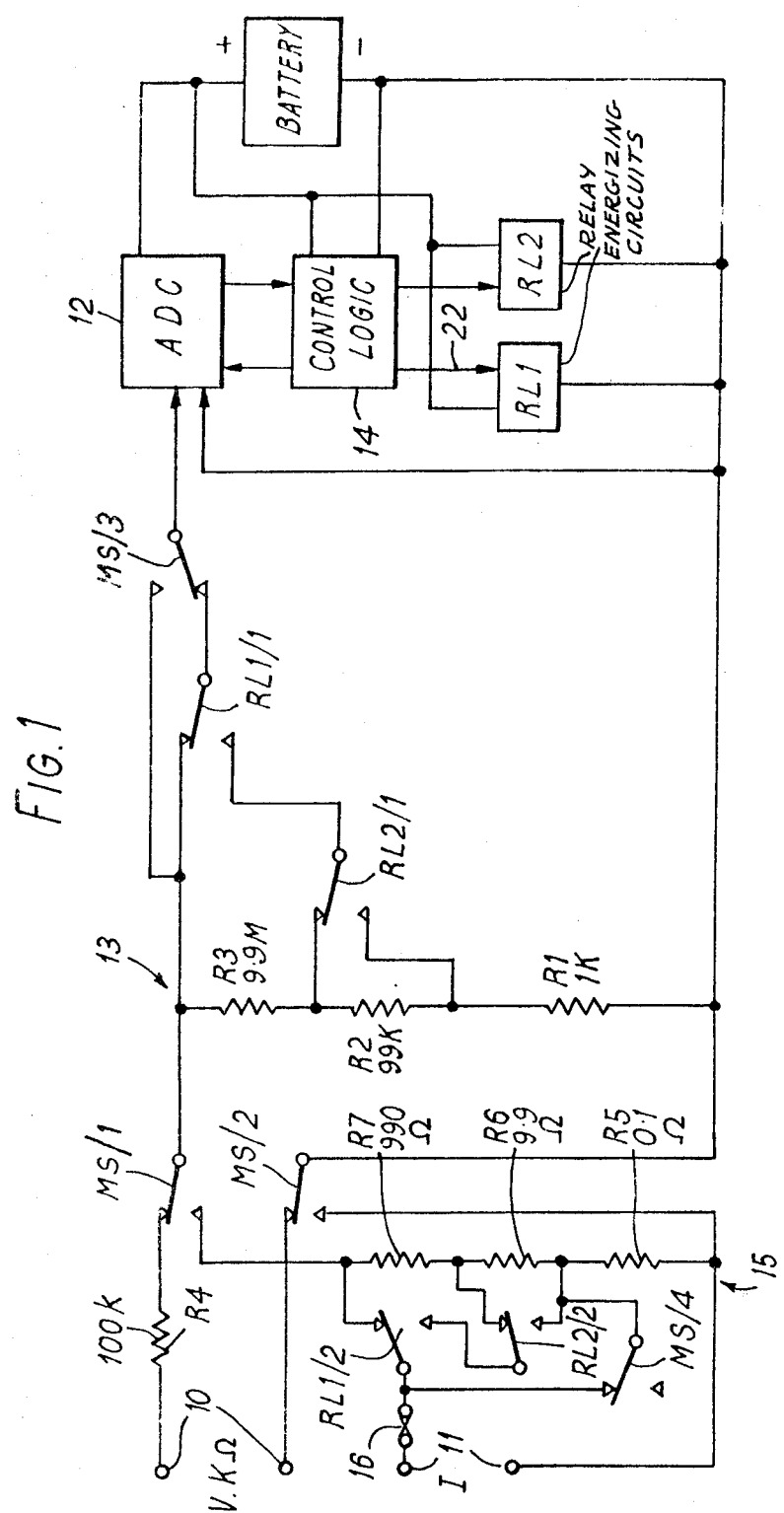
FIG. 1 is a block diagram of an autoranging digital multimeter embodying the invention.

Referring to FIG. 1, terminals 10 are provided for a voltage input V (or when measuring resistance as denoted by the legend KΩ) and terminals 11 are provided for a current input I. The mode of operation is selected by a five-pole, two-way mode switch (MS) with ganged contacts MS/1 to MS/4 (FIG. 1) and MS/5 (FIG. 5). The switch is shown in the voltage mode in which the terminals 10 are connected to the input of an A D C 12 via a switched attenuator 13 formed by a potential divider chain R1, R2, R3. Thus MS/1 and MS/2 connect the terminals 10 across the potential divider and MS/3 connect the output of the potential divider to the A D C. The A D C may be of conventional form, e.g. a dual slope converter such as is described in our U.K. Pat. No. 1090047 or a mark-space converter such as is described in our U.K. Pat. No. 1434414.

The illustrated resistor values in FIG. 1 will apparently give ranges differing by factors of 100 rather than factors of 10. In fact the A D C 12 can include an input amplifier whose gain is switched by factors of 10 (by further contacts of RL1 and RL2, not shown) in such a way that the ranges differ by factors of 10 and the digital output is kept within the range N/10 (approximately) to N. This is not necessary, however, since the resistor values R1, R2 and R3 can be made to comply with the equation:

$$R1+R2+R3=10(R1+R2)=100R1.$$

Similar remarks apply mutatis mutandis to the resistors R5, R6 and R7.

A 100k protection resistor 24 is connected in series with the voltage HI terminal to prevent arcing at the relay contacts (to be described) when a very high input voltage is applied. This introduces a 1% error in the attenuated input voltage, which error is removed by appropriate scaling in the A D C 12, i.e. the A D C is adjusted to read 1% high. The resistor may be positioned as shown but is advantageously between the contacts MS/1 and the top end of the attenuator 13 (to give protection in the current mode as well as the voltage mode).

The autoranging facility is controlled by control logic 14 and two latching relays RL1 and RL2 shown with the contacts detached and denoted RL1/1 etc. The voltage input ranges are as tabulated below, the states of the relays being denoted UP and DOWN in accordance with the contact positions in FIG. 1 or X meaning "don't care".

| Range | Voltage Ranges | | Input to ADC taken across |
|---|---|---|---|
| | RL1 | RL2 | |
| Low | UP | X | R1 + R2 + R3 |
| Mid | DOWN | UP | R1 + R2 |
| High | DOWN | DOWN | R1 |

It can be seen from FIG. 1 that the voltage range is selected in this manner by RL1/1 and RL2/1. The logic 14 is of a very simple nature and acts in response to knowledge of the existing range and overrange and underrange signals provided from the A D C (as explained below) as follows:

| Existing Range | Range Switching Out of Range Signal | Action |
|---|---|---|
| Low | Overrange | Change over RL1(to DOWN) |
| Low | Underrange | No action |
| Mid | Overrange | Change over RL2(to DOWN) |
| Mid | Underrange | Change over RL1(to UP) |
| High | Overrange | Signal error |
| High | Underrange | Change over RL2(to UP) |

In this scheme the "don't care" state of RL2 will in fact be UP.

In the current mode, MS/1 and MS/2 connect the current input terminals 11 to the input of the ADC 12. In the illustrated embodiment this is effected by connecting the terminals 11 across the potential divider R1, R2, R3 while MS/3 by-passes RL1/1 and RL2/1 so that the input to the ADC is the voltage developed across R1+R2+R3. Range switching is now effected by a switched current shunt 15 in parallel with R1+R2+R3. The shunt 15 comprises resistors R5, R6 and R7 selected by RL1/2 and RL2/2 in accordance with the following scheme:

| Range | Current Ranges | | Value of Shunt |
|---|---|---|---|
| | RL1 | RL2 | |
| Low | UP | X | R5 + R6 + R7 = 1000Ω |
| Mid | DOWN | UP | R5 + R6 = 10Ω |
| High | DOWN | DOWN | R5 = 0.1Ω |

The relays RL1 and RL2 thus select the range in exactly the same way, on the basis of the digital output from the ADC, whether the meter is in the voltage mode or the current mode. In the current mode, as RL1/2 and RL2/2 change over to effect the autoranging, RL1/1 and RL2/1 change in sympathy but are without effect because they are bypassed by MS/3. MS/3 could be omitted if the switched attenuator 13 were placed up-stream of the contacts MS/1 and MS/2, i.e. between the terminals 10 and MS/1 and MS/2.

In the voltage mode, as RL1/1 and RL2/1 change over to effect autoranging, RL1/2 and RL2/2 change in sympathy. It is important that this does not lead to changes in the impedance shunting the terminals 11 because these may be left connected to the circuit under test, which could be disturbed by the impedance changes. For this reason the mode switch has further contacts MS/4 which, in the voltage mode, by-pass RL1/2 and RL2/2 and connect just R5 across the terminals 11. The current circuit includes a protective fuse 16.

Figure 2:
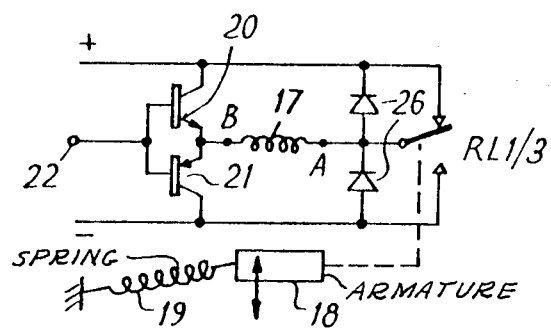
FIG. 2 shows the circuit of one latching relay.

The latching relays RL1 and RL2 are identical and just one (RL1) will therefore be described. FIG. 2 shows a simple circuit with the coil 17 of the relay controlling contacts RL1/3; the contacts RL1/1 and RL2/2 are now shown. The relay has a permanent magnet armature 18 which can therefore be operated to the UP or DOWN relay position in accordance with the polarity of the current through the coil 17 (producing attraction of repulsion of the armature). The armature is stable in each position under the influence of means symbolically shown as an over-centre spring 19.

The relay can be rendered stable in each position by a permanent magnet co-operating with a part of the armature. Such relays are commercially available, e.g. Varley type VPR4/DM/CFB/3/Celanex, manufactured by Oliver Pell Control Limited, Woolwich, London, S.E.18.

The coil 17 has ends A and B. The end A is connected to the moving contact of RL1/3 whose fixed contacts are connected to battery + and battery − respectively. The end B is connected to the emitters of an npn transistor 20 and a pnp transistor 21. The transistors are in series between battery+and battery−and have their bases connected to a common control terminal 22 also shown in FIG. 1.

The signal on the terminal 22 is logical HIGH or LOW corresponding to the relay UP and DOWN positions. In the illustrated UP position, as long as the control signal remains HIGH, transistor 21 is biased off and no current flows. When the signal goes LOW, transistor 21 conducts and current flows through the coil 17 from A to B. This changes over the relay to the DOWN position, in which the relay latches with no current in the coil. When the signal goes HIGH again, transistor 20 conducts and current flows through the coil from B to A. This changes the relay to the UP position in which the relay latches, again with no current in the coil.

The relay thus follows the control signal but coil current is only drawn briefly when the relay actually changes over. Battery power is thus conserved. Nevertheless a problem can arise with this simple circuit in that although the current is brief, it has to be heavy; the resistance of the coil 17 is very low. This can collapse the battery volts before the relay changes over.

Figure 3:
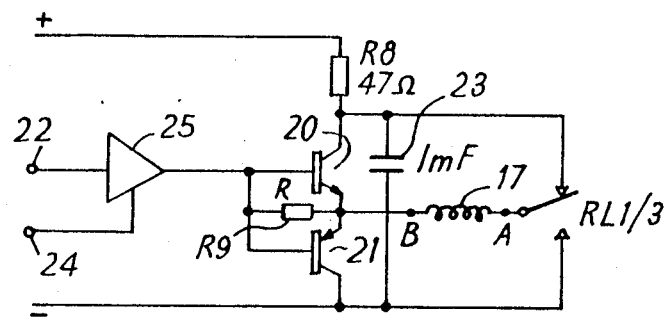
FIG. 3 shows an improved latching relay circuit.

In order to overcome this problem, the improved circuit of FIG. 3 can be used, the mechanical parts not being shown. The supply for the coil is not now provided directly from the battery but from a capacitor 23 which is charged continuously from battery + via a resistor R8. A pulse of current can be taken periodically to energise the coil 17 without collapsing the battery volts.

In order to give the capacitor time to recover its charge, the logic drive is pulsed and this necessitates a third, inactive input state from which the signal to the bases of the transistors is pulsed to HIGH or LOW in accordance with the level of the signal on terminal 22. To this end, in FIG. 3, the control signal is applied to a type 74126 non-inverting tristate TTL buffer amplifier 25 which is strobed by a short, recurring pulse on a terminal 24, derived for example from the clock pulse circuit within the ADC 12.

In between pulses, the amplifier 25 has a high output impedance and a resistor R9 ensures that no current flows in the transistors 20 and 21. When a strobe pulse occurs, the amplifier output is driven to the HIGH or LOW level in accordance with the control signal from the control logic 14 on terminal 22. The relay changes over, as in FIG. 2, if its position does not correspond to the control signal logical level. Diodes 26 (shown only in FIG. 2) can be used conventionally to suppress inductive spikes when the contacts RL1/3 change over.

Figure 4:
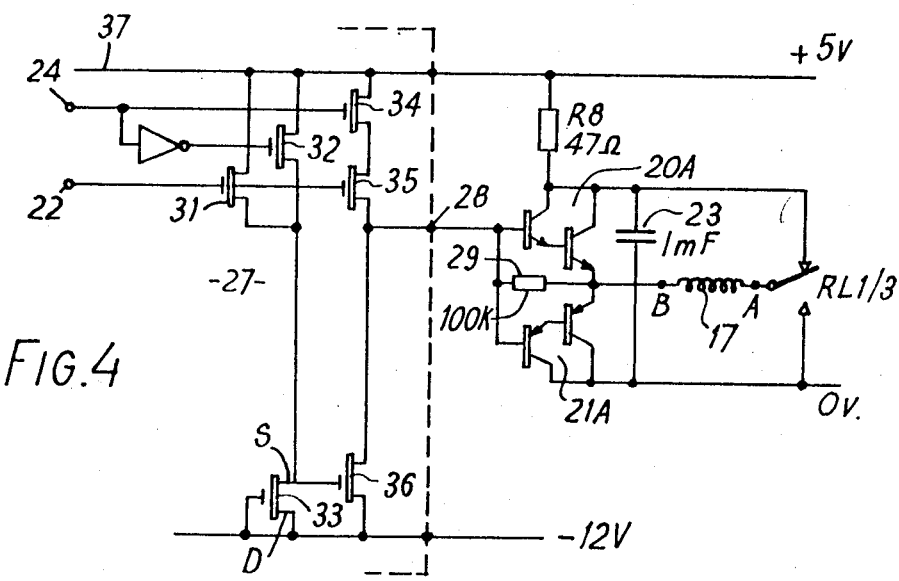
FIG. 4 shows a practical form of latching relay circuit employing FET's.

An alternative circuit is shown in FIG. 4. The TTL amplifier 25 is replaced by MOS circuitry 27 which can be incorporated in LSI circuits forming the control logic 14. Also in FIG. 4, the transistors 20 and 21 have been replaced by Darlington pairs 20A and 21A.

The six transistors 31 to 36 of the circuitry 27 are all enhancement-mode PMOS transistors (somewhat analogous to PNP transistors), with their respective sources (analogous to emitters) connected towards the positive supply rail and their respective drains (analogous to collectors) connected towards the negative supply rail. The two transistors 34, 36 are normally non-conductive, so that the terminal 28 is normally effectively open circuit. If a logic 1 (a negative voltage) is applied to terminal 22, it renders the transistors 31 and 35 conductive. A negative-going strobe pulse applied to terminal 24 renders transistor 34 conductive, so that current can be supplied via the transistors 34, 35 to the Darlington pair 20A of the relay operating circuit (if RL1/3 is correctly positioned). The transistor 32 is held conductive via the inverter, except during the strobe pulse, but as long as either one of the transistors 31 and 32 is conductive, the transistor 33 holds the transistor 36 non-conductive.

However, if a logic 0 (near-zero voltage) is applied to terminal 22, the transistors 31 and 35 are rendered non-conductive. Thus, when the inverted version of the strobe pulse renders the transistor 32 non-conductive as well, the transistor 33 is permitted to render the transistor 36 conductive. Current can then be taken from the relay operating circuit (again if the RL1/3 is correctly positioned), thus turning on the Darlington pair 21A.

The expressions negative and near-zero above are used in relation to the upper supply rail 37 of the LSI circuitry 27.

The circuitry 27 is duplicated for each relay RL1 and RL2; only a single connection is required for each relay from the control logic, i.e. the connection 28 in FIG. 4. The capacitor 23 (and resistor R8) can be common to both relays provided the strobe pulses on terminals 24 occur at different times for the two relays as is achieved by applying these pulses to the two terminals 24 alternately. One pair of strobe pulses is timed to occur in each measurement cycle of the ADC 12. The relay positions are therefore checked every cycle although no power is taken unless a change is required.

Although auto-ranging control circuits are known per se and will be constructed to suit the particula6 ADC which is employed, FIG. 5 shows one suitable circuit by way of example, the battery connections of FIG. 1 being omitted.

The output of the ADC 12 consists of pulses wich are fed to a BCD counter 40 in which the digital output of the ADC is formed. The output (bit-parallel) of this counter is applied conventionally to a decoder and display device (not shown) which indicates the digital output to the user.

The control logic 14 includes timing logic 41 which operates in conjunction with the A D C to establish the measurement cycle of the meter. At the commencement of the measurement cycle, the logic 41 clears the counter 40 (via line 42) which then counts up to the digital output corresponding to the analog input to the A D C. The timing logic then emits a first strobe pulse on a line 43 and enables two comparators 44 and 45. The comparator 44 is preset to emit a pulse, when strobed, if the number in the counter 40 is overrange, that is to say it exceeds an upper preset number. This is a pulse commanding an UP range shift. The comparator 45 is preset to emit a pulse, when strobed, if the number in the counter 40 is underrange, that is to say it is less than a lower preset number. This is a pulse commanding a DOWN range shift. The values of the upper and lower preset numbers will depend on the resolution and read-out range of the meter. With a 5-digit resolution suitable values are 19999 and 01800 respectively. The lower preset number is made 01800 rather than 02000 in order to introduce a hysteresis effect which will prevent repeated range switching when the measured value is very close to a range change value. For a 4-digit resolution the numbers could be 9999 and say 0090 (rather than 0100).

The UP and DOWN pulses are applied to bi-directional, 2-bit range counter 46 whose states represent the different ranges. The outputs of the counter 46 are applied to a range/mode decoder 47 which also receives a mode signal from further contacts MS/5 of the mode switch. The mode switch is logical HIGH or LOW depending upon whether the selected mode is Volts, KΩ or Current. As well as providing conventional range-determining information to the display, the decoder 47 provides the logical signals for controlling the relay RL1 (on line 22) and for controlling the relay RL2 (on line 22$^1$). Thus the signal on each line 22, 22$^1$ will be HIGH or LOW, corresponding to the UP and DOWN positions of the corresponding relay.

It follows that, during the latter part of each measurement cycle, the first strobe pulse on line 43 causes the comparators 44 and 45 to check whether the existing range is correct and if not to pulse the counter 46 up or down as the case may be. This establishes the correct logical levels on the lines 22 and 22$^1$.

The timing logic 41 then emits a second strobe pulse on line 48 which is shaped by a pulse amplifier 49 and applied to the strobe terminal 24 for the relay RL1. After a suitable delay, provided by a delay circuit 50 and allowing time for the capacitor 23 to recharge, if need be, the second strobe pulse is applied via a pulse amplifier 51 to the strobe terminal 24$^1$ for the relay RL2.

What is claimed is:

1. An auto-ranging analog-to-digital converter, comprising:
    a range-swiching input circuit for receiving an analog input signal to be converted and for producing, in response to said analog input signal, an analog output signal whose magnitude lies within a predetermined range of values and is representative of the magnitude of the analog input signal, said range-switching circuit including at least one relay having first and second switching states;
    an analog-to-digital conversion circuit connected to receive the analog output signal produced by the range-switching circuit, for converting said analog output signal into a digital signal representative of the magnitude of the analog input signal; and
    a control circuit responsive to said digital signal to produce a control signal operative to select the respective switching state of said at least one relay which tends to bring the magnitude of the analog output signal produced by the range-switching circuit within said predetermined range of values;
    said at least one relay being a latching relay which is stable in each of said first and second switching states, and which comprises an armature movable between, and stable in, either of first and second positions corresponding to said first and second switching states respectively, and coil means having first and second inputs for receiving respective operating current pulses for moving said armature between its first and second positions, a current pulse received at the first input being effective to move the armature to the first position and a current pulse received at the second input being effective to move the armature to the second position; and said control circuit including pulse generator means for producing control pulses and a relay operating circuit responsive to said control pulses and said control signal to produce said operating current pulses and to apply them to a respective one of the first and second inputs of the coil means in dependence upon said control signal.

2. A converter as claimed in claim 1 wherein:
    the coil means comprises a coil whose opposite ends constitute said first and second inputs respectively;
    the relay further includes first and second terminals for connection to a source of energising current and a changeover contact which connects one end of the coil to the first and second terminals in the first and second switching states respectively of the relay; and
    the relay operating circuit includes first and second semiconductor switching devices connected between the other end of the coil and the first and second terminals respectively and selectively operable in response to said control pulses and said control signal to complete a current path for current through the coil, of a sense determined by the position of said changeover contact, if the control signal indicates that the switching state of the relay requires changing.

3. A converter as claimed in claim 2, wherein said at least one relay further comprises a capacitor connected between the first and second terminals.

4. A converter as claimed in claim 2, wherein the first and second switching devices comprise at least one pnp transistor and at least one npn transistor respectively with series-connected emitter-collector circuits, and wherein the control signal is a two-state signal and the relay operating circuit comprises means responsive to said control pulses and to said control signal to apply negative-going pulses to the bases of said transistors for one state of the control signal and to apply positive-going pulses to the bases of said transistors for the other state of the control signal, whereby only one of said transistors, determined by the state of the control signal, is rendered conductive, said relay operating circuit having a high output impedance between such positive-going and negative-going pulses.

5. A digital multimeter comprising an analog-to-digital converter in accordance with claim 1, wherein the range-switching input circuit comprises voltage input terminals, a range-switching voltage attenuator connected between said voltage input terminals, separate current input terminals, a range-switching current shunt connected between said current input terminals, and a mode switch for selectively applying the voltage output of the attenuator or the voltage generated across the shunt to the analog-to-digital conversion circuit as said analog output signal.

6. A digital multimeter as claimed in claim 5, wherein said at least one relay has a first set of contacts forming part of the range-switching voltage attenuator and a second set of contacts forming part of the range-switching current shunt, and wherein said mode switch includes contacts which, when the mode switch is set to apply the voltage output of the attenuator to the analog-to-digital conversion circuit, are operative to bypass the second set of contacts of the relay and to connect a fixed impedance between the current input terminals.

* * * * *